(12) United States Patent
Zhang et al.

(10) Patent No.: US 11,616,083 B2
(45) Date of Patent: Mar. 28, 2023

(54) DISPLAY

(71) Applicant: SHENZHEN CHINA STAR OPTOELECTRONICS SEMICONDUCTOR DISPLAY TECHNOLOGY CO., LTD., Guangdong (CN)

(72) Inventors: Qi Zhang, Guangdong (CN); Wu Cao, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 344 days.

(21) Appl. No.: 16/620,776

(22) PCT Filed: Nov. 8, 2019

(86) PCT No.: PCT/CN2019/116675
§ 371 (c)(1),
(2) Date: Dec. 9, 2019

(87) PCT Pub. No.: WO2021/082057
PCT Pub. Date: May 6, 2021

(65) Prior Publication Data
US 2021/0358960 A1 Nov. 18, 2021

(30) Foreign Application Priority Data

Oct. 30, 2019 (CN) .......................... 201911041556.4

(51) Int. Cl.
*H01L 27/12* (2006.01)

(52) U.S. Cl.
CPC .................................. *H01L 27/124* (2013.01)

(58) Field of Classification Search
CPC .................................................... H01L 27/124
See application file for complete search history.

(56) References Cited

U.S. PATENT DOCUMENTS

| 2015/0316822 A1 | 11/2015 | Takeda et al. |
| 2018/0107040 A1 | 4/2018 | Yeh et al. |
| 2019/0131320 A1* | 5/2019 | Shin ...................... H01L 27/124 |
| 2019/0146284 A1 | 5/2019 | Bae et al. |
| 2019/0296048 A1* | 9/2019 | Lee ......................... H01L 27/14 |
| 2021/0048716 A1* | 2/2021 | Cheng ............... G02F 1/134309 |

FOREIGN PATENT DOCUMENTS

| CN | 104375340 A | * | 2/2015 | ....... G02F 1/134309 |
| CN | 104375340 A | | 2/2015 | |
| CN | 106353939 A | | 1/2017 | |

(Continued)

*Primary Examiner* — Peter M Albrecht

(57) ABSTRACT

The present invention provides a display including: a substrate; a plurality of data lines disposed above the substrate; and a pixel electrode disposed above the plurality of data lines, and including: at least one first trunk and a plurality of second trunks extending along a first direction; a plurality of first branches; and a plurality of second branches, wherein distal ends of the plurality of first branches and distal ends of the plurality of second branches are staggered and connected to each other at positions corresponding to the plurality of data lines.

4 Claims, 2 Drawing Sheets

(56) References Cited

FOREIGN PATENT DOCUMENTS

| | | | |
|---|---|---|---|
| CN | 106569364 A | | 4/2017 |
| CN | 109634012 A | | 4/2019 |
| CN | 109799657 A | | 5/2019 |
| CN | 110297361 A | | 10/2019 |
| JP | 2010128211 A | * | 6/2010 |
| TW | 201500822 A | | 1/2015 |

* cited by examiner

DISPLAY

BACKGROUND OF INVENTION

Field of Invention

The present invention relates to a display, and more particularly to a display having a pixel electrode designed to improve longitudinal crosstalk.

Description of Prior Art

With rapid development of the display market, display features such as large sizes, high resolution, and wide viewing angles have become more and more popular. In order to improve quality of motion picture and resolution of large-sized panels, a half-gate two-data line (HG2D line) driving architecture is usually adopted, providing a great improvement effect. However, since the data line exists between pixels, a signal change of the data lines makes an electric field formed between the data lines and the pixels, resulting in a voltage difference between an upper and lower electrode layers fluctuates, and thus vertical crosstalk occurs.

In order to solve the problem of vertical crosstalk in traditional HG2D panels, there is an urgent need to develop a novel pixel electrode design.

SUMMARY OF INVENTION

In view of the above, the present invention provides a display including a novel pixel electrode design, which can effectively shield influence of data lines on an upper substrate, and thereby improves the vertical crosstalk phenomenon by intersecting slits on opposite sides of each of the data lines to form a dendritic structure above the data lines, or by directly adding a trunk of a pixel electrode corresponding to each of the data lines above the data lines.

Accordingly, in accordance with an embodiment of the present invention, the present invention provides a display including: a substrate; a plurality of data lines disposed above the substrate; and a pixel electrode disposed above the plurality of data lines, and including: at least one first trunk and a plurality of second trunks extending along a first direction, wherein projections of the at least one first trunk and the plurality of second trunks on the substrate are not overlapped with projections of the data lines on the substrate, and the at least one first trunk is alternately arranged with the plurality of second trunks; a plurality of first branches extending from opposite sides of the at least one first trunk; and a plurality of second branches extending from one side of each of the plurality of second trunks, wherein distal ends of the plurality of first branches and distal ends of the plurality of second branches are staggered and connected to each other at positions corresponding to the plurality of data lines.

In an embodiment of the present invention, the plurality of first branches and the plurality of second branches are parallel to each other on opposite sides of each of the plurality of data lines.

In an embodiment of the present invention, an angle between the plurality of first branches on the opposite sides of the first trunk is greater than 0 degrees and less than 180 degrees.

In an embodiment of the present invention, an angle between the plurality of first branches on opposite sides of the at least one first trunk and the at least one first trunk is greater than 0 degrees and less than 90 degrees.

In an embodiment of the present invention, the pixel electrode has a plurality of slits disposed between the at least one first trunk, the plurality of second trunks, the plurality of first branches, and the plurality of second branches.

According to another embodiment of the present invention, a display is provided, including: a plurality of data lines disposed above the substrate; and a pixel electrode disposed above the plurality of data lines, and including: at least one first trunk, a plurality of second trunks, and a plurality of third trunks extending along a first direction, wherein projections of the at least one first trunk and the plurality of second trunks on the substrate are not overlapped with projections of the data lines on the substrate, and projections of the plurality of third trunks on the substrate are coincident with the projections of the data lines on the substrate; a plurality of first branches extending from opposite sides of the at least one first trunk; and a plurality of second branches extending from one side of each of the plurality of second trunks, wherein distal ends of the plurality of first branches and distal ends of the plurality of second branches are connected to opposite sides of each of the plurality of third trunks, respectively.

In an embodiment of the present invention, the at least one first trunk is alternately arranged with the plurality of second trunks, and the plurality of third trunks are disposed between the at least one first trunk and the plurality of second trunks.

In an embodiment of the present invention, the plurality of first branches and the plurality of second branches are parallel to each other on opposite sides of each of the plurality of third trunks to which they are connected, respectively.

In an embodiment of the present invention, an angle between the plurality of first branches on the opposite sides of the first trunk is greater than 0 degrees and less than 180 degrees, and an angle between the plurality of first branches on opposite sides of the at least one first trunk and the at least one first trunk is greater than 0 degrees and less than 90 degrees.

In an embodiment of the present invention, the pixel electrode has a plurality of slits disposed between the at least one first trunk, the plurality of second trunks, the plurality of third trunks, and the plurality of first branches, and the plurality of second branches.

The present invention provides a display including a novel pixel electrode design, which can effectively shield influence of data lines on an upper substrate, and thereby improves the vertical crosstalk phenomenon by intersecting slits on opposite sides of each of the data lines to form a dendritic structure above the data lines, or by directly adding a trunk of a pixel electrode corresponding to each of the data lines above the data lines.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

Figure 1:
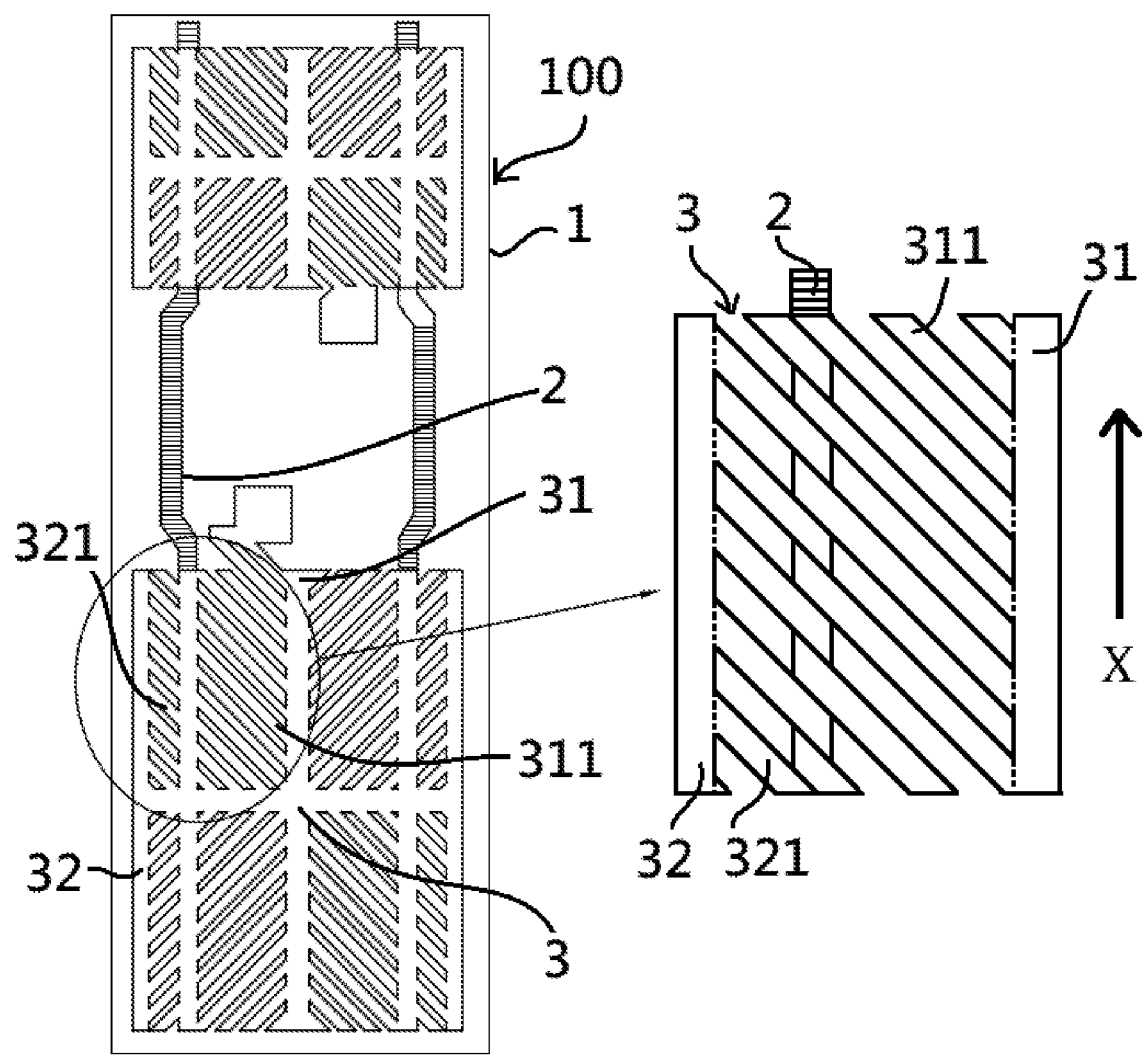
FIG. 1 is a schematic diagram of a display in accordance with an embodiment of the present invention.

In order to make the above description of the present invention more comprehensible, the preferred embodiments are described below in detail with reference to the accompanying drawings.

The following description of the various embodiments is provided to illustrate the specific embodiments of the invention. Directional terms mentioned in the present invention, such as "vertical", "horizontal", "upper", "bottom", "pre", "post", "left", "right", "inside", "outside", "side", etc., only refer to the direction of the additional drawing. Therefore, the directional terminology used is for the purpose of illustration and understanding of the invention. In the figures, structurally similar elements are denoted by the same reference numerals.

In order to solve the problem of the vertical crosstalk phenomenon in the conventional HG2D panel, an embodiment of the present invention provides a display including a novel pixel electrode design, which can effectively shield influence of data lines on an upper substrate, and thereby improves the vertical crosstalk phenomenon by intersecting slits on opposite sides of each of the data lines to form a dendritic structure above the data lines, or by directly adding a trunk of a pixel electrode corresponding to each of the data lines above the data lines.

FIG. 1 is a schematic diagram of a display in accordance with an embodiment of the present invention. As shown in FIG. 1, in particular, a display 100 according to an embodiment of the present invention includes: a substrate 1; a plurality of data lines 2 disposed above the substrate 1; and a pixel electrode 3 disposed above the plurality of data lines 2, and including: at least one first trunk 31 and a plurality of second trunks 32 extending along a first direction X, wherein projections of the at least one first trunk 31 and the plurality of second trunks 32 on the substrate 1 are not overlapped with projections of the data lines 2 on the substrate 1, and the at least one first trunk 31 is alternately arranged with the plurality of second trunks 32; a plurality of first branches 311 extending from opposite sides of the at least one pixel 31; and a plurality of second branches 321 extending from one side of each of the plurality of second trunks 32, wherein distal ends of the plurality of first branches 311 and distal ends of the plurality of second branches 321 are staggered and connected to each other at positions corresponding to the plurality of data lines 2.

As shown in FIG. 1, in an embodiment of the present invention, the plurality of first branches 311 and the plurality of second branches 321 are parallel to each other on opposite sides of each of the plurality of data lines 2.

As shown in FIG. 1, in an embodiment of the present invention, an angle between the plurality of first branches 311 on the opposite sides of the first trunk 31 is greater than 0 degrees and less than 180 degrees.

As shown in FIG. 1, in an embodiment of the present invention, an angle between the plurality of first branches 311 on opposite sides of the at least one first trunk 31 and the at least one first trunk 31 is greater than 0 degrees and less than 90 degrees.

As shown in FIG. 1, in an embodiment of the present invention, the pixel electrode 3 has a plurality of slits disposed between the at least one first trunk 31, the plurality of second trunks 32, the plurality of first branches 311, and the plurality of second branches 321.

Figure 2:
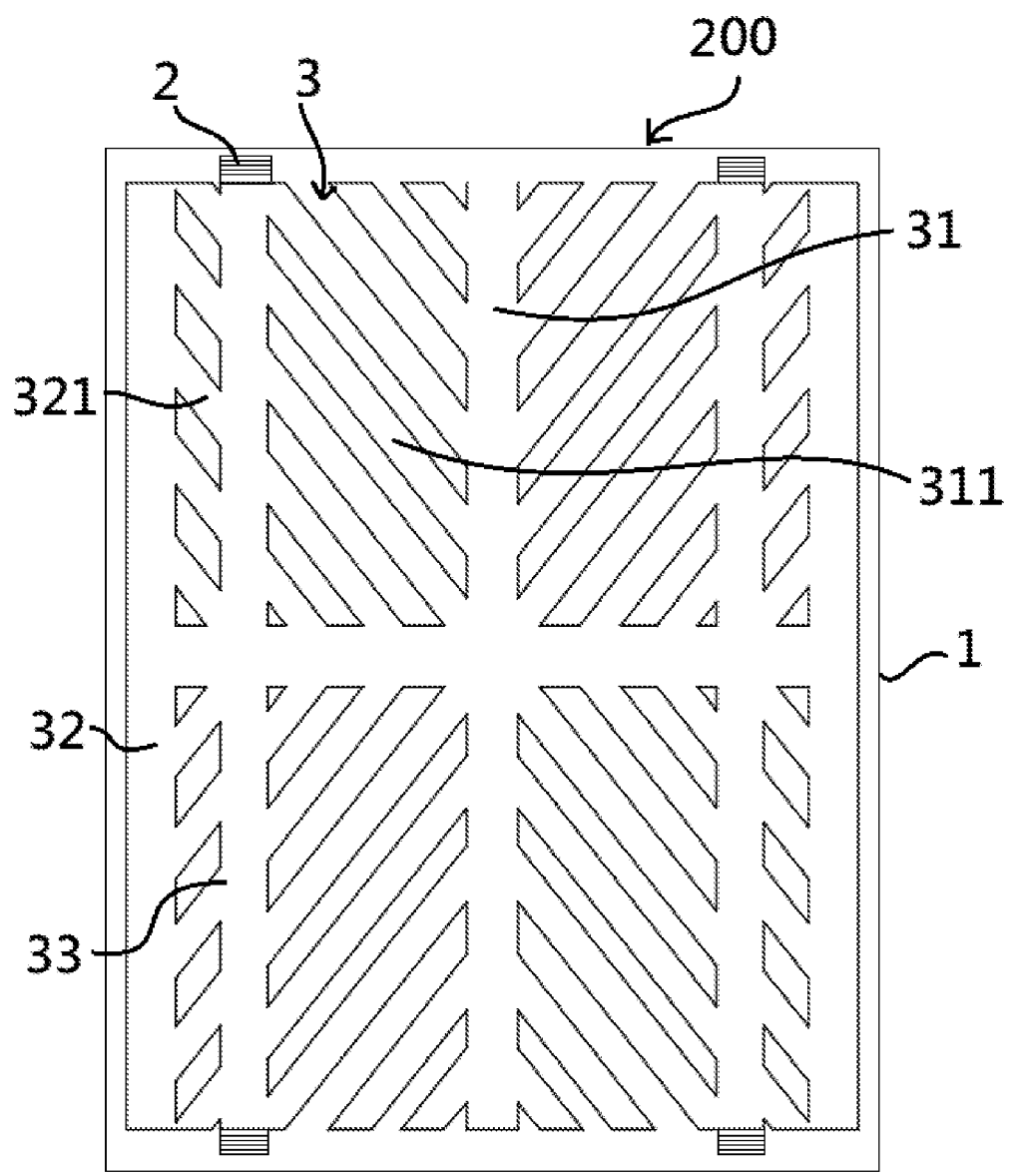
FIG. 2 is a schematic diagram of a display in accordance with another embodiment of the present invention.

FIG. 2 is a schematic diagram of a display in accordance with an embodiment of the present invention. As shown in FIG. 2, in particular, a display 200 according to an embodiment of the present invention includes: a substrate 1; a plurality of data lines 2 disposed above the substrate 1; and a pixel electrode 3 disposed above the plurality of data lines 2, and including: at least one first trunk 31, a plurality of second trunks 32, and a plurality of third trunks 33 extending along a first direction X, wherein projections of the at least one pixel 31 first trunk 31 and the plurality of second trunks 32 on the substrate 1 are not overlapped with projections of the data lines 2 on the substrate 1, and projections of the plurality of third trunks 33 on the substrate 1 are coincident with the projections of the data lines 2 on the substrate 1; a plurality of first branches 311 extending from opposite sides of the at least one first trunk 31; and a plurality of second branches 321 extending from one side of each of the plurality of second trunks 32, wherein distal ends of the plurality of first branches 311 and distal ends of the plurality of second branches 321 are connected to opposite sides of each of the plurality of third trunks 33, respectively.

As shown in FIG. 2, in an embodiment of the present invention, the at least one first trunk 31 is alternately arranged with the plurality of second trunks 32, and the plurality of third trunks 33 are disposed between the at least one first trunk 31 and the plurality of second trunks 32.

As shown in FIG. 2, in an embodiment of the present invention, the plurality of first branches 311 and the plurality of second branches 321 are parallel to each other on opposite sides of each of the plurality of third trunks 33 to which they are connected, respectively.

As shown in FIG. 2, in an embodiment of the present invention, an angle between the plurality of first branches 311 on the opposite sides of the first trunk 31 is greater than 0 degrees and less than 180 degrees, and an angle between the plurality of first branches 311 on opposite sides of the at least one first trunk 31 and the at least one first trunk 31 is greater than 0 degrees and less than 90 degrees.

As shown in FIG. 2, in an embodiment of the present invention, the pixel electrode 3 has a plurality of slits disposed between the at least one first trunk 31, the plurality of second trunks 32, the plurality of third trunks 33, and the plurality of first branches 311, and the plurality of second branches 321.

Accordingly, the present invention provides a display including a novel pixel electrode design, which can effectively shield influence of data lines 2 on an upper substrate 1, and thereby improves the vertical crosstalk phenomenon by intersecting slits on opposite sides of each of the data lines 2 to form a dendritic structure above the data lines 2, or by directly adding a trunk of a pixel electrode corresponding to each of the data lines 2 above the data lines 2.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:
1. A display, wherein the display comprises:
a substrate;
a plurality of data lines disposed above the substrate; and a pixel electrode disposed above the plurality of data lines, and comprising:

at least one first trunk, a plurality of second trunks, and a plurality of third trunks extending along a first direction, wherein projections of the at least one first trunk and the plurality of second trunks on the substrate are not overlapped with projections of the data lines on the substrate, and projections of the plurality of third trunks on the substrate are coincident with the projections of the data lines on the substrate;

a plurality of first branches extending from opposite sides of the at least one first trunk; and a plurality of second branches extending from one side of each of the plurality of second trunks, wherein distal ends of the plurality of first branches and distal ends of the plurality of second branches are connected to opposite sides of each of the plurality of third trunks, respectively;

wherein the pixel electrode has a plurality of slits disposed among the at least one first trunk, the plurality of second trunks, the plurality of third trunks, the plurality of first branches, and the plurality of second branches; and wherein the data lines are free from exposure of the slits.

2. The display according to claim 1, wherein the at least one first trunk is alternately arranged with the plurality of second trunks, and the plurality of third trunks are disposed between the at least one first trunk and the plurality of second trunks.

3. The display according to claim 1, wherein the plurality of first branches and the plurality of second branches are parallel to each other on the opposite sides of each of the plurality of third trunks to which they are connected, respectively.

4. The display according to claim 1, wherein an angle between the plurality of first branches on the opposite sides of the at least one first trunk is greater than 0 degrees and less than 180 degrees, and an angle between the plurality of first branches on the opposite sides of the at least one first trunk and the at least one first trunk is greater than 0 degrees and less than 90 degrees.

* * * * *